United States Patent [19]

Lee et al.

[11] Patent Number: 5,712,818
[45] Date of Patent: Jan. 27, 1998

[54] DATA LOADING CIRCUIT FOR PARTIAL PROGRAM OF NONVOLATILE SEMICONDUCTOR MEMORY

[75] Inventors: Sung-Soo Lee; Jin-Ki Kim, both of Seoul, Rep. of Korea

[73] Assignee: Samsung Electronics Co., Ltd., Rep. of Korea

[21] Appl. No.: 537,615

[22] Filed: Oct. 2, 1995

[30] Foreign Application Priority Data

Oct. 1, 1994 [KR] Rep. of Korea ............... 25243/1994

[51] Int. Cl.⁶ .................................................. G11C 16/04
[52] U.S. Cl. ........................... 365/185.23; 365/185.21; 365/189.05
[58] Field of Search ................. 365/185.21, 189.05, 365/185.23, 185.22

[56] References Cited

U.S. PATENT DOCUMENTS

| | | | |
|---|---|---|---|
| 4,901,281 | 2/1990 | Yoshida et al. | 365/185.23 |
| 5,239,505 | 8/1993 | Fazio et al. | 365/185.21 |
| 5,262,984 | 11/1993 | Noguchi et al. | 365/185.21 |
| 5,335,198 | 8/1994 | Van Buskirk et al. | 365/185.21 |
| 5,363,330 | 11/1994 | Kobayashi et al. | 365/185.23 |
| 5,381,369 | 1/1995 | Kikuchi et al. | 365/185.21 |
| 5,473,563 | 12/1995 | Suh et al. | 365/189.05 |

FOREIGN PATENT DOCUMENTS 022167  3/1994  Rep. of Korea.

*Primary Examiner*—David C. Nelms
*Assistant Examiner*—Michael T. Tran
*Attorney, Agent, or Firm*—Cushman Darby & Cushman IP Group of Pillsbury Madison & Sutro LLP

[57] ABSTRACT

The present invention provides a nonvolatile semiconductor memory comprising a plurality of floating gate-type memory cells arranged in a matrix form of rows and columns; a plurality of bit lines connected the memory cells arranged in the direction of said column; a plurality of data lines respectively connected to the plurality of bit lines; a plurality of latch circuits respectively connected to said plurality of data lines; a preset unit for presetting the plurality of latch circuits to predetermined logic states during a presetting operation; a unit for loading data to selected ones of the plurality of latch circuits through data input/output terminals during a data loading operation after the presetting operation; and unit for programming to the memory cells arranged and erased in one selected row, data loaded to the latch circuits of the selected portion and data presetted to remaining latch circuits except for the latch circuits of the selected portion during a programming operation after the data loading operation.

12 Claims, 8 Drawing Sheets

DATA LOADING CIRCUIT FOR PARTIAL PROGRAM OF NONVOLATILE SEMICONDUCTOR MEMORY

BACKGROUND OF THE INVENTION

1. Field of the Invention

The present invention relates to a nonvolatile semiconductor memory, and more particularly to a data loading circuit for partial program utilized in the nonvolatile semiconductor memory device.

2. Description of the Related Art

A programming operation which writes data to memory cells in the nonvolatile semiconductor memory, for example an electrically erasable and programmable read only memory (referred to as "EEPROM" hereinafter) is generally carried out by inputting external data after simultaneously erasing the memory cells. As higher density EEPROM have been achieved, longer programming times are required. In order to solve the above described problems, the EEPROM comprises a plurality of memory cells arranged in a matrix form of rows and columns, a plurality of bit lines connected to the memory cells arranged in the direction of the columns, and a plurality of latch circuits (i.e. page buffer) respectively connected to the plurality of bit lines. After data which is inputted from several external data input/output terminals is sequentially stored in the page buffers, the data stored is simultaneously programmed to all memory cells in the same selected row. This is called a page program. Also, the operation for storing data inputted from the external data input/output terminals in the plurality of latch circuits is referred to as "data loading".

FIG. 1 shows a data loading circuit for performing a conventional data loading operation. For the convenience of illumination, a data loading circuit associated with a k-th column block CBk is illustrated, but it should be appreciated that 8 data loading circuits are arranged in the row direction.

For example, a 16Mbit EEPROM has a memory cell array having memory cells arranged in a matrix form of 8,192 rows and 2,048 columns. The memory cell array is divided into 8 column blocks CBk (where k=0,1,2, . . . ,7) respectively corresponding to data input/output terminals I/O0 to I/O7, and each of the column blocks has 256 bit lines (or column lines) BLk-1 to BLk-256 arranged in parallel in the column direction. The bit lines are connected with floating gate type memory cells arranged in the column direction. The bit lines BLk-1 to BLk-256 associated with each of the column blocks CBk are respectively connected to connection nodes 24 through depletion mode MOS transistors (hereinafter referred to as "D-type transistors") 22 and 23 having their channel paths serially connected. The gates of the D-type transistors 22 and 23 are each connected with a power supply voltage Vcc and a control signal $\phi_1$. The connection nodes 24 are each connected with data lines 26 through channel paths of N-channel MOS transistors 25 (hereinafter referred to as "N-type transistors"), and separating gates of the N-type transistors 25 are connected with a separating control signal SBL. The data lines 26 are connected to the latch circuits 28 consisting of inverters 1 and 2, respectively. The data lines 26 are connected with input terminals of the inverters 1, and output terminals of the inverters 1 are connected with input nodes 27. The input nodes 27 are connected with input terminals of inverters 2, and the output terminals of the inverters 2 are respectively connected with the data lines 26. Between the input nodes 27 and ground Vss, channel paths of N-type transistors 30 and 31 are connected in series to each other. Between the power supply voltage Vcc and gates of N-type transistors 30, P-channel MOS transistors (referred to as "P-type transistors", hereinafter) 32 are connected respectively. Gates of the P-type transistors 32 are commonly connected with a line 37, and one end of the line 37 is connected to the gate and drain of the P-type transistor 33 and to the drain of P-type transistor 34. Drain-source paths of the P-type transistors 33 and 34 are connected in parallel between one end of the line 37 and the power supply voltage Vct. Between one end of the line 37 and ground Vss, channel paths of N-type transistors 35 and 36 are connected in series each other. The gates of the N-type transistors 35 are connected with reference voltage Vref of about 1.7 volts, and the gates of the P-type transistor 34 and the N-type transistor 36 are connected to a control signal $\phi_3$ maintaining "L" state during a data loading operation. A current mirror circuit 38 is formed by the transistors 32 to 36 and the line 37. The gates of the N-type transistors 31 are connected with a control signal $\phi_2$ maintaining "L" state during a data loading operation. The data lines 26 are connected with the channel paths of N-type transistors 29 respectively, and the gates of the N-type transistors 29 are connected with a control signal $\phi_5$ maintaining "H" state during the data loading operation. Between drains of the N-type transistors 29 and common node 39, channel paths of transmission transistors T1 to T256 are connected respectively and a data input/output buffer 42 is connected between the common node 39 and the data input/output terminal I/Ok. Gates of the transmission transistors T1 to T256 are each connected with transmission lines TL1 to TL256, and the transmission lines TL1 to TL256 and the column decoder 40 for decoding the column address signals from a column address buffer (not shown). A column selecting circuit 41 consists of the transmission transistors T1 to T256 and the column decoder 40.

Now, the data loading operation according to the prior art will be described. For convenience of explanation, it is assumed that the one selected row of memory cells associated to 256-th bit lines BLk-256 selected among the column blocks CBk (k=0,1,2, . . . ,7) are programmed into data "0". Latch circuits 28 associated with bit lines BLk-1 to BLk-255 which are not selected for such a page program should store data for preventing the selected one row of memory cells connected to the nonselected bit lines BLk-1 to BLk-255 frown being programmed. For example, assuming that that data is "1", all latch circuits 28 associated to the nonselected bit lines BLk-1 to BLk-255 should store the data "1". In order to carry out the data loading operation, the separating control signal SBL, the control signal $\phi_2$ and the control signal $\phi_3$ are in the "L" states and the control signal $\phi_5$ is in the "L" state. In these states, the column decoder 40 responds to the column address signals of 256 cycles according to toggling of an external write enable signal $\overline{WE}_x$ (not shown) in order to turn on the transmission transistors T1 to T256 sequentially. At the same time, the data input/output buffers 42 corresponding to a column blocks CBk respond to toggling of the signal $\overline{WE}_x$ in order to sequentially output data inputted to the data input/output terminals I/Ok. Therefore, the data "1" of one byte is inputted to the data input/output terminals I/Ok at all cycles from a first cycle to a 255-th cycle, and at the 256-th cycle the required program data "0" of a byte is inputted to the data input/output terminals I/Ok. Therefore the program data may be stored to all latch circuits 28 associated with nonselected bit lines BLk-1 to BLk-255. After the above-described data loading operation is completed, the program operation is carried out. The program operation is carried out by maintaining the separating control signal SBL and the control signal $\phi_1$ to be in the "H" states. The above-described data loading and programming techniques are disclosed in U.S. patent application Ser. No. 08/171,300, entitled "Nonvolatile Semiconductor Memories" and assigned to the same assignee, Samsung Electronics Co., Ltd., as in the present application. Erasing of memory cells prior to programming thereof has been disclosed in the aforesaid U.S. patent application Ser. No. 08/171,300, and Korean Patent Application No. 1994-22167 filed by the aforesaid assignee on Sep. 3, 1994.

In order to execute a page program as described above, a conventional data loading operation causes a data loading time to be unnecessarily longer because the latch circuits corresponding to the memory cells which do not need to be programmed must still be loaded with non-program data. Therefore, an EEPROM with high performance and which reduces the data loading time is required.

SUMMARY OF THE INVENTION

Accordingly, it is an object according to the present invention to provide a nonvolatile semiconductor memory device with high performance which can reduce the data loading time.

In order to accomplish the object of a invention, there is provided the nonvolatile semiconductor memory comprising a plurality of floating gate type memory cells arranged in the matrix form of rows and columns, a plurality of bit lines connected to memory cells arranged in the direction of columns, a plurality of data lines respectively connected to the plurality of bit lines, a plurality of latch circuits respectively connected to the plurality of data lines, a preset unit for presetting the plurality of latch circuits to the predetermined logic states during the presetting operation, a data load unit for loading data onto selected ones of the plurality of latch circuits through the data input/output terminals during the data loading operation after the presetting operation, and a program performing unit for programming to the memory cells arranged and erased in one selected row, the data loaded to the selected latch circuits during the programming operation after the data loading operation and the data presetted to remaining latch circuits except for the selected latch circuits.

Further, there is provided a method of performing a partial page program after erasing the memory cells arranged in at least one selected row in the nonvolatile semiconductor memory comprising a plurality of floating gate type memory cells arranged in the matrix form of rows and columns, a plurality of bit lines connected to the memory cells arranged in the direction of columns, a plurality of data lines connected to the plurality of bit lines respectively, a plurality of latch circuits connected the plurality of data lines respectively, and a plurality of data input/output terminals, wherein the method comprising the steps of: presetting the plurality of latch circuits to predetermined data, loading data to selected ones among the plurality of latch circuits through the plurality of data input/output terminals, and programming to the memory cells arranged in the one selected row the data which is stored in the plurality of latch circuits, wherein the predetermined data which is preset to the remaining latch circuits except for the selected latch circuits prevents the corresponding memory cells thereto from being programmed.

BRIEF DESCRIPTION OF THE DRAWINGS

The following is a detailed description of this invention by the reference of the attached drawings, in which like numbers indicate the same or similar elements.

DETAILED DESCRIPTION OF THE PREFERRED EMBODIMENT

Figure 1:
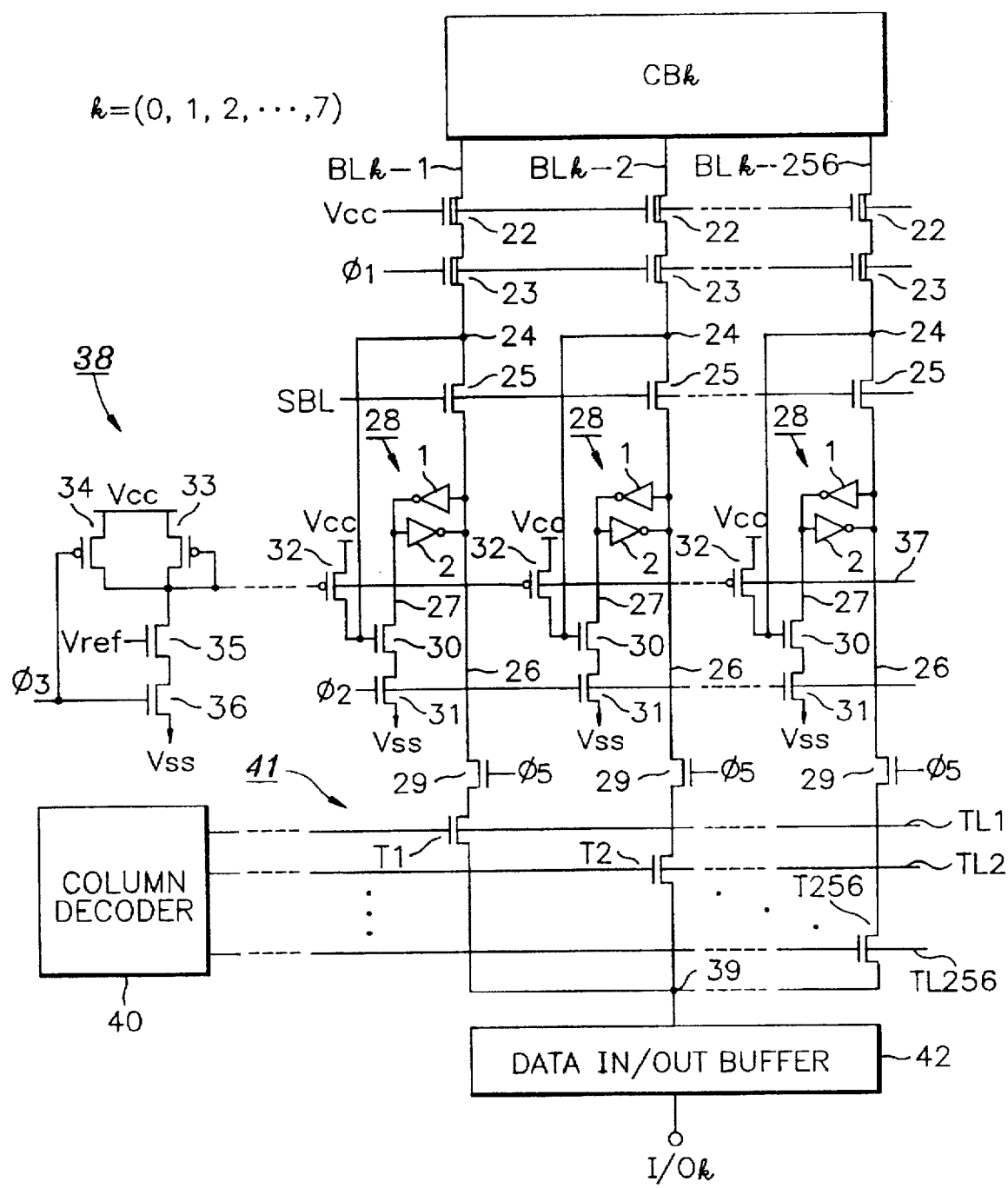
FIG. 1 is a schematic circuit diagram illustrating a conventional data loading circuit.
Figure 2:
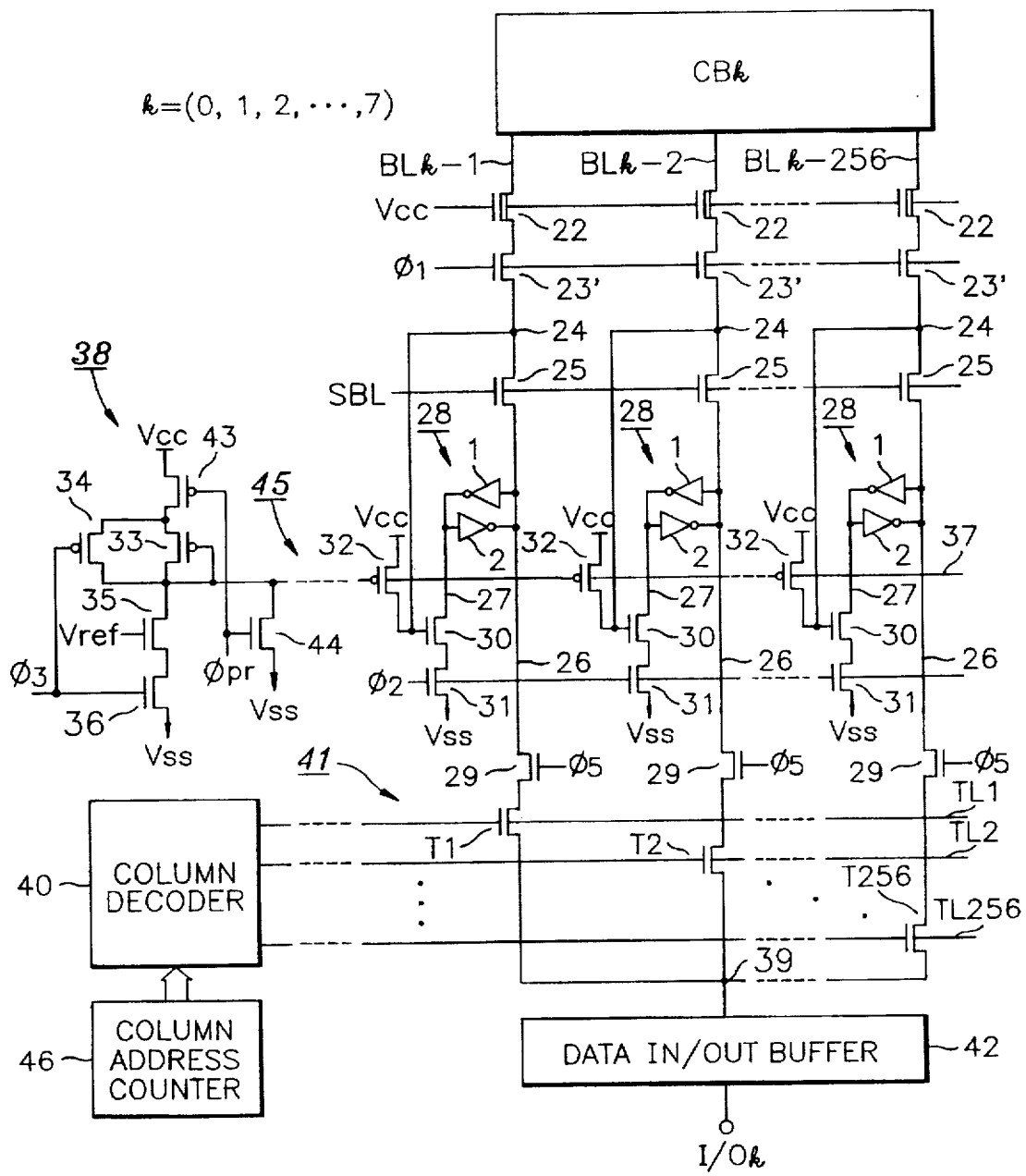
FIG. 2 is a schematic circuit diagram illuminating a data loading circuit according to a desired embodiment of the present invention.

Referring to FIG. 2, a data loading circuit in FIG. 2 is the same as a data loading circuit in FIG. 1, except for N-type transistors 23' having channel paths connected between sources of D-type transistors 22 and connection nodes 24, N-type transistor 44 having a channel path connected between a line 37 and ground potential Vss, a P-type transistor 43 having a channel path connected between a power supply voltage Vcc and sources of P-type transistors 33 and 34, a preset control signal $\phi_{pr}$ connected to gates of the P-type transistor 43 and the N-type transistor 44 and a column address counter 46 connected to a column decoder 40.

The N-type transistor 44 responds to the preset control signal $\phi_{pr}$ in order to preset to data "1", which prevents the corresponding memory cells from being programmed, the latch circuits 28 connected with the data lines 26 prior to the data loading operation. In response to the preset control signal $\phi_{pr}$, N-type transistor 44 and 30 and a P-type transistor 32 are turned on, and in response to the control signal $\phi_2$, a N-type transistor 31 is turned on. Therefore, during a presetting operation before the data loading operation, the preset unit 45 which consists of the transistors 30 to 32 and 44 connected to the latch circuits 28 acts to set the data lines 26 connected to the latch circuits 28 to the data "1". The P-type transistor 43 responds to the preset control signal $\phi_{pr}$ during the presetting operation so that it acts to prevent current consumption. The column address counter 46 which is connected with the column decoder 40 and constitutes a column selecting circuit 45 along with the column decoder 40 inputs external address signals through a known address buffer (not shown) and responds to toggling of an external write enable signal $\overline{WE}_x$ during the data loading operation after the presetting operation so that it acts to count up the external address signals. The column decoder 40 responsive to the address signals sequentially turns on the transmission transistors designated from the address signals. Therefore, data which is inputted from the data input/output terminals I/Ok is stored in corresponding latch circuits through corresponding transmission transistors. Accordingly, a data input buffer 42 and the column selecting circuit 45 serve as a loading unit for loading onto the corresponding latch circuits 28 data inputted through the data input/output terminals I/Ok during the data loading operation. The column address counter 46 is employed in a preferred embodiment of the invention, but the address buffer (not shown) may input the external address signals according to a toggling of the external write enable signal $\overline{WE}_x$, thereby turning on the transmission transistors through the column decoder 40 without any implementation of the column address counter 46. Data which is inputted through the data input/output terminals I/Ok through the turned-on transmission transistors can then be directly stored in the corresponding latch circuits 28.

Figure 3A:
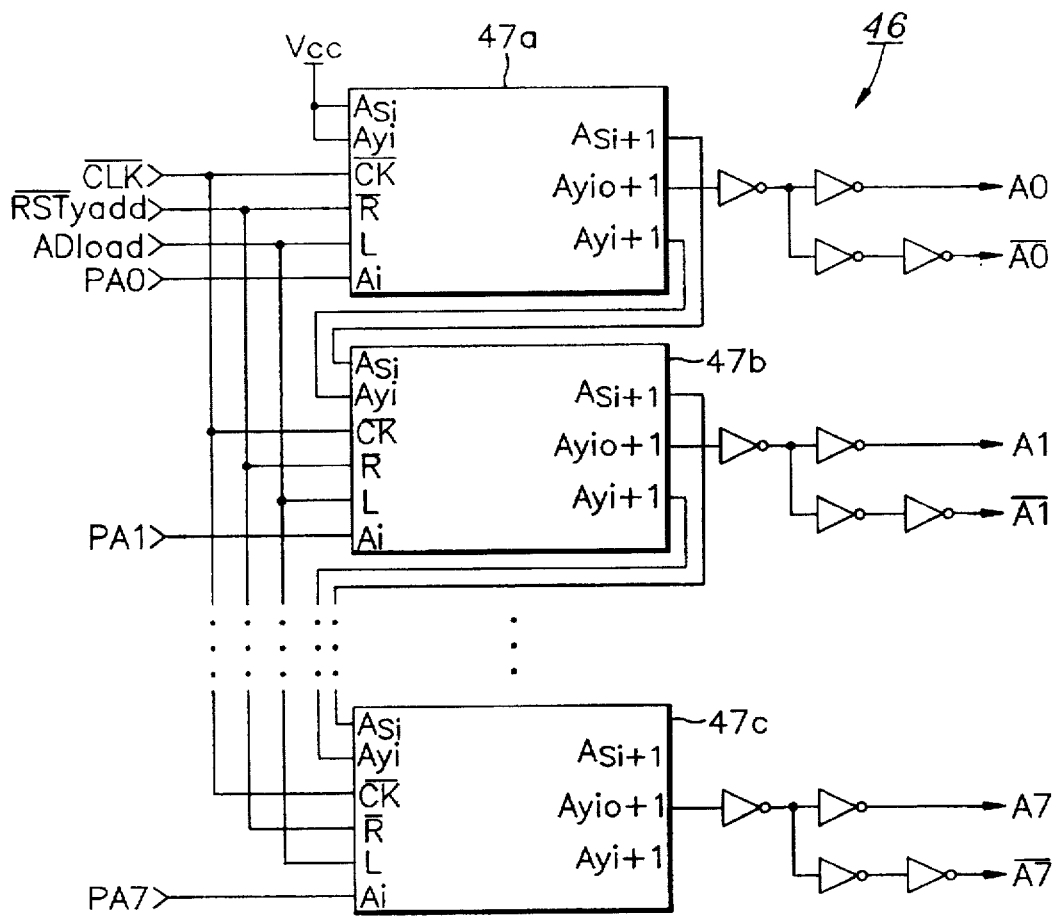
FIGS. 3A and 3B are schematic circuit diagrams illuminating a column address counter of FIG. 2.
Figure 3B:
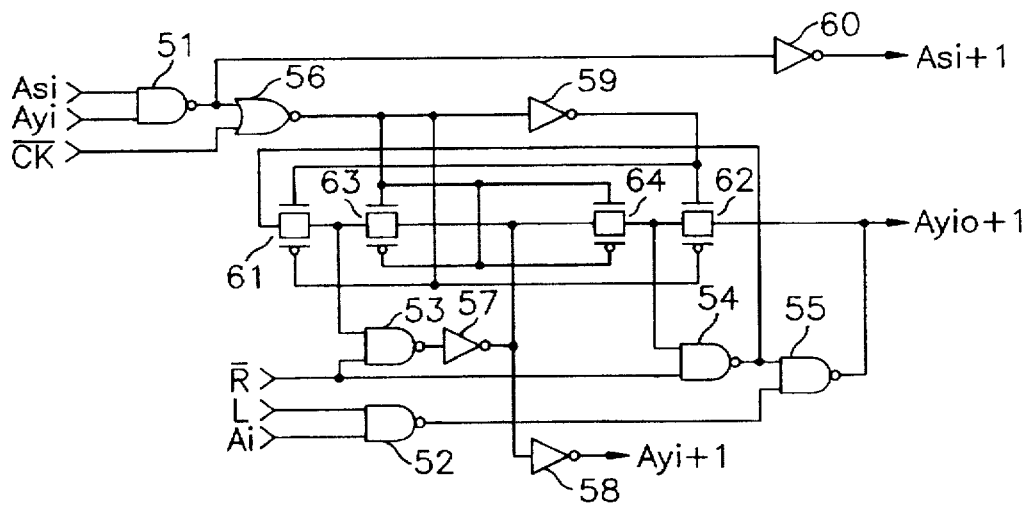

FIG. 3A is a schematic circuit diagram illuminating the column address counter, and FIG. 3B is a schematic circuit diagram illuminating each stage which constitutes the column address counter in FIG. 3A.

Each stage of the column address counter 46 shown in FIG. 3B consists of NAND gates 52 to 55, NOR gate 56, inverters 57 to 60, and transmission gates 61 to 64. In the drawings, an input terminal $\overline{R}$ is a reset terminal, an input terminal L is an address load terminal, an input terminal Ai is an address input terminal, and an input terminal $\overline{CK}$ is a clock input terminal. An output terminal Ayio+1 is an address output terminal. The address output is reset by the reset signal $\overline{RST}_{yadd}$ inputted to the reset terminal $\overline{R}$. When an address load signal ADload which is inputted to the address load terminal L is in "H" state, the column address signal which is inputted to the address input terminal Ai is loaded.

Referring to FIG. 3A, the input terminals Asi and Ayi of a first stage 47a of the column address counter 46 are connected to the power supply voltage Vcc, that is, to the "H" state, and output terminals Asi+1 and Ayi+1 thereof are respectively connected to input terminals Asi and Ayi of a second stage 47b. In the same manner as mentioned above, the output terminals Asi+1 and Ayi+1 of one stage are respectively connected to the input terminals Asi and Ayi of next stage. A clock signal $\overline{CLK}$, the reset signal $\overline{RST}_{yadd}$ and the address load signal ADload are respectively inputted to the input terminals $\overline{CK}$, $\overline{R}$ and L of the stages 47a to 47e. Also, address signals PA0 to PA7 from the address buffer are each inputted to the address input terminals Ai of the stages 47a to 47c. Column address signals A0 to A7 and their corresponding column address signals $\overline{A}_0$ to $\overline{A}_7$ are outputted from the address output terminals Ayio+1 of the stages 47a to 47e.

FIGS. 4 and 5 is a schematic circuit diagram illuminating a control circuit for generating the control signals which drive the data loading circuit of FIG. 2 according to a preferred embodiment of the invention.

Figure 4A:
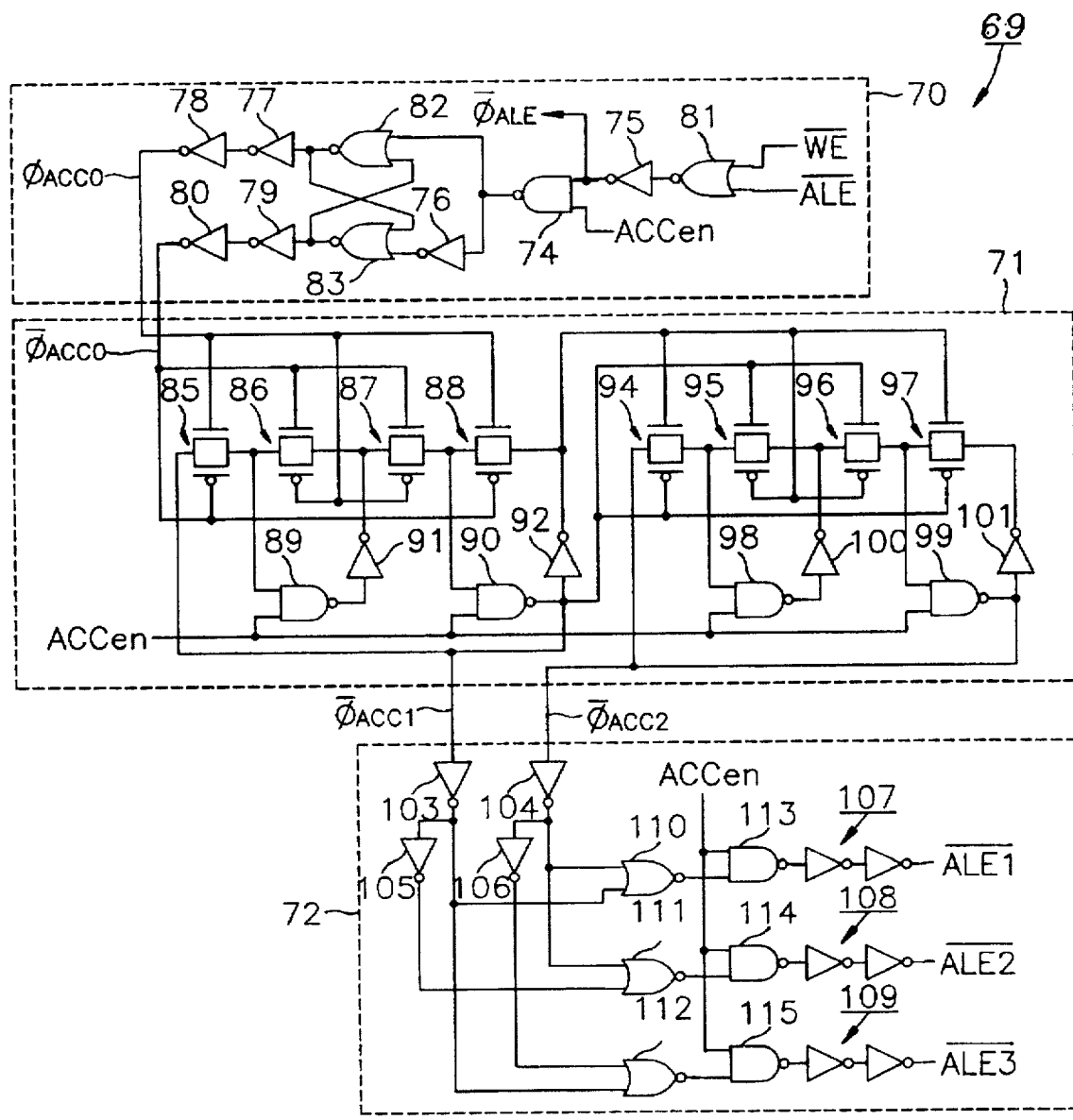
FIGS. 4A–4D are schematic circuit diagrams illuminating a control circuit for generating control signals which control the data loading circuit of FIG. 2.

Referring to FIG. 4A, there is provided an address input control circuit 69 for generating address cycle latch enable signals $\overline{ALE1}$ to $\overline{ALE3}$ for latching to the address buffer (not shown) the external row and column address signals which are inputted from the input/output terminals I/00 to I/07, during the address loading operation prior to the data loading operation. The address input control circuit 69 consists of an address cycle clock generating circuit 70 for responding to a compensating signal $\overline{ALE}$ of an address latch enable signal ALE and an write enable signal $\overline{WE}$ from the control buffer (not shown) to which an external write enable signal $\overline{WE}_x$ and an external address latch enable signal ALEx are inputted, in order to generate an address latch clock $\overline{\phi}_{ALE}$, an address cycle clock $\phi_{ACC0}$ and its compensating clock $\overline{\phi}_{ACC0}$, an address cycle counter 71 for counting the address cycle clock $\phi_{ACC0}$ and generating address cycle counting clocks $\overline{\phi}_{ACC1}$ and $\overline{\phi}_{ACC2}$, and an address cycle decoder 72 for decoding the address cycle counting clocks and generating the address cycle latch enable signals $\overline{ALE1}$ to $\overline{ALE3}$.

The address cycle clock generating circuit 70 consists of an NAND gate 74 and inverters 75 to 80 and NOR gates 81 to 83. The address cycle counter 71 consists of a first stage consisting of the transmission gates 85 to 88, NAND gates 89 and 90 and inverters 91 and 92, and a second stage consisting of the transmission gates 94 to 97, NAND gates 98 and 99 and inverters 100 and 101. The address cycle decoding circuit 72 consists of inverters 103 to 109, NOR gates 110 to 112 and NAND gates 113 to 115. The address input control circuit 69 is activated by an address cycle counter enable signal ACCen.

Figure 4B:
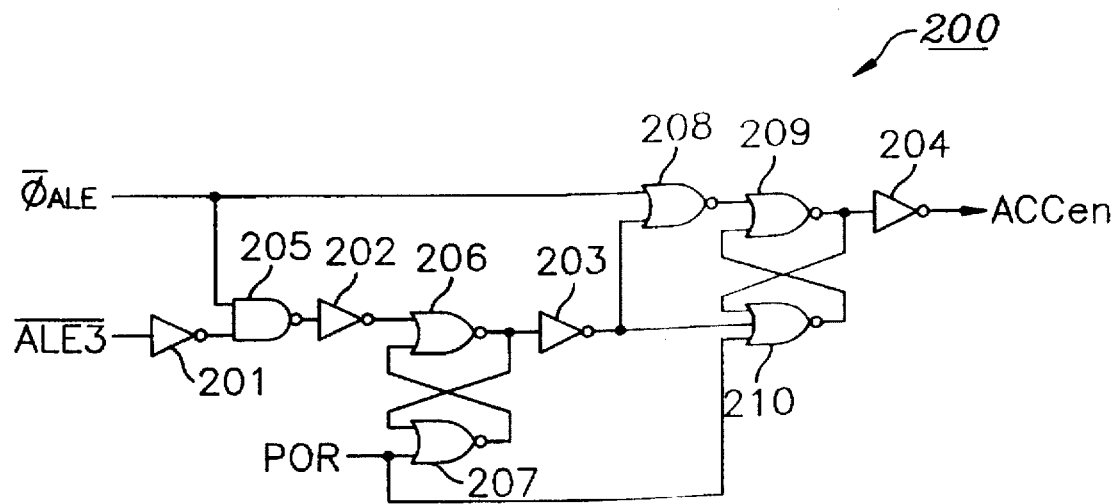

Referring to FIG. 4B, there is provided a control circuit 200 for generating the address cycle counter enable signal ACCen. The control circuit 200 consists of inverters 201 to 204, a NAND gate 205, and NOR gates 206 to 210. At an initial state to which a power supply voltage Vcc is applied, a power-on reset signal POR from a general power-on reset circuit which generates a short pulse in the "H" state enables the address cycle counter enable signal ACCen to be in the "L" state. The signal ACCen goes to the "L" state by an address latch clock $\overline{\phi}_{ALE}$, the clock $\overline{\phi}_{ALE}$ going to the "L" state goes to the "H" state when the address cycle counter enable signal $\overline{ALE3}$ is in the "L" state.

Figure 4C:
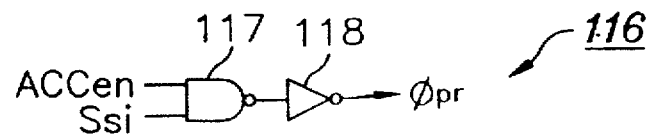

Referring to FIG. 4C, there is provided a control circuit 116 which generates a preset signal $\phi_{pr}$ responsive to the address cycle counter enable signal ACCen in FIG. 4B and a data loading command flag signal Ssi from a command register (not shown). The control circuit 116 consists of a NAND gate 117 to which the address cycle counter enable signal ACCen and the data loading command flag signal Ssi are inputted, and an inverter 118 to which an output of the NAND gate 117 is connected.

Figure 4D:
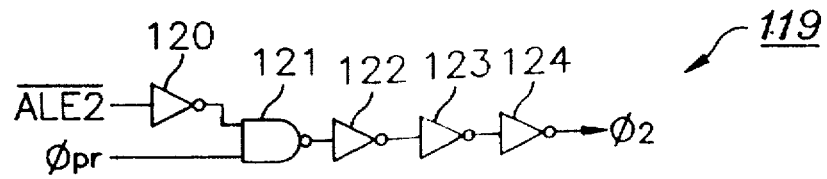

Referring to FIG. 4D, there is provided a control circuit 119 which generates a control signal $\overline{\phi}_2$ in response to the preset signal $\phi_{pr}$ and the address cycle latch enable signal $\overline{ALE2}$ from the address cycle decoder 72 in FIG. 4A. The control circuit 119 consists of an inverter 120 to which the address cycle latch enable signal $\overline{ALE2}$ is inputted, a NAND gate 121 to which an output of the inverter 120 and the preset signal $\phi_{pr}$ are inputted, and inverters 122 to 124 connected in series to each other to which an output of the NAND gate 121 is inputted.

Figure 5A:
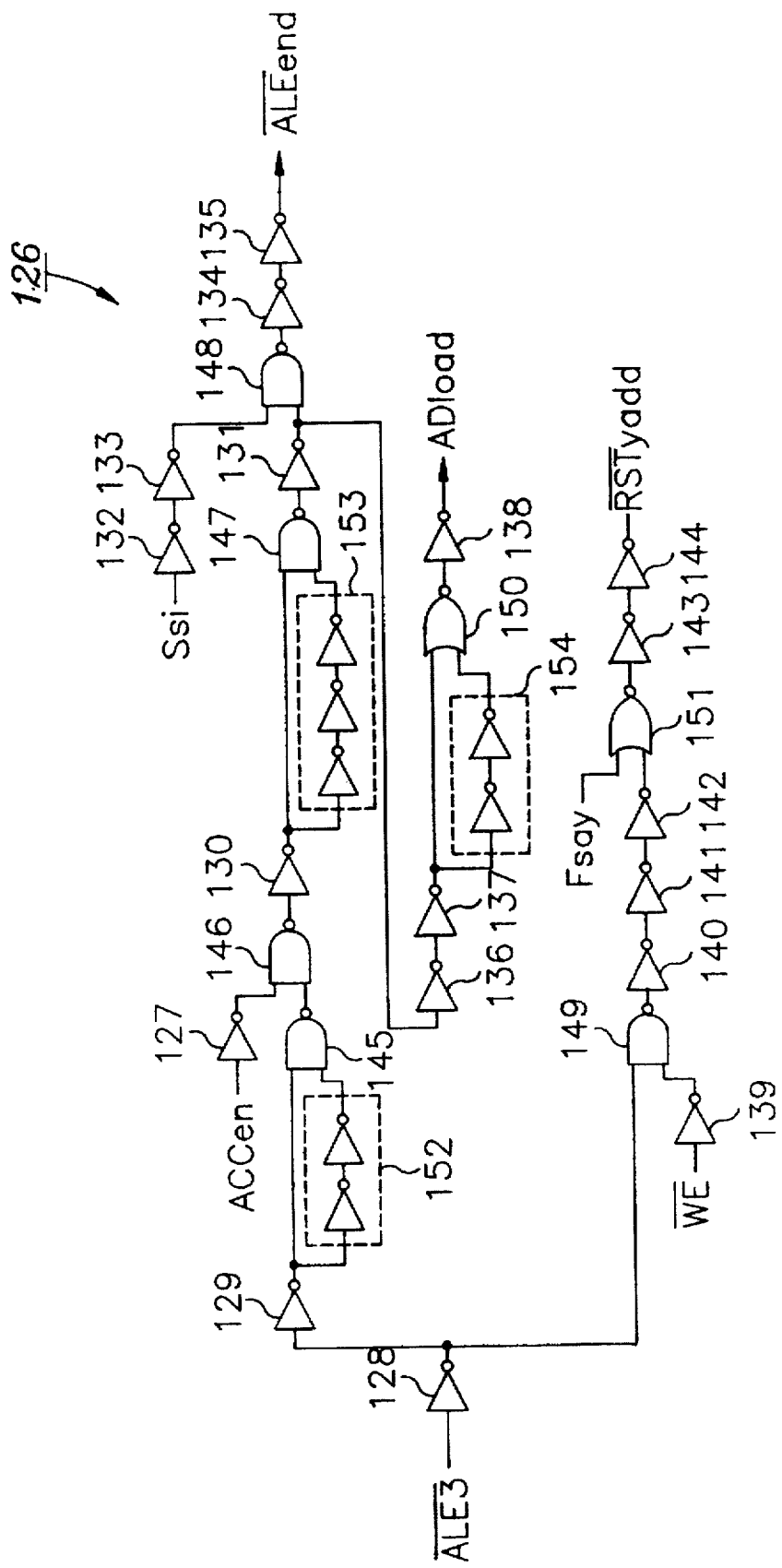
FIGS. 5A–5C are schematic circuit diagrams illuminating a control circuit for generating the control signals which control the column address counter of FIGS. 3A and 3B.

Referring to FIG. 5A, a control circuit 126 for controlling the column address counter 46 in FIG. 3A is shown. The control circuit 126 consists of inverters 127 to 144, NAND gates 145 to 149, NOR gates 150 and 151, delay circuits 152 and 154 consisting of an even number of inverters, and delay circuit 153 consisting of an odd number of inverters. The address cycle counter enable signal ACCen in FIG. 4B is connected to an input terminal of the inverter 127. The data loading command flag signal Ssi is inputted to an inverter 132. The address cycle latch enable signal $\overline{ALE3}$ from an address cycle decoder 72 in FIG. 4A is inputted to an inverter 128. Two input terminals of a NAND gate 149 are each connected to an output terminal of the inverter 128 and an output terminal of an inverter 139 to which the write enable signal $\overline{WE}$ is inputted. Two input terminals of the NOR gate 151 are connected to a most significant bit count signal Fsay indicative of a most significant bit (MSB) when the column address counter 46 in FIG. 3A reaches the most significant bit (MSB), and to an output terminal of an inverter 142. Therefore, the reset signal $\overline{RST}_{yadd}$ is reset to the "L" state by the signal Fsay which goes to the "H" state when the column address counter 46 reaches the MSB.

Figure 5B:
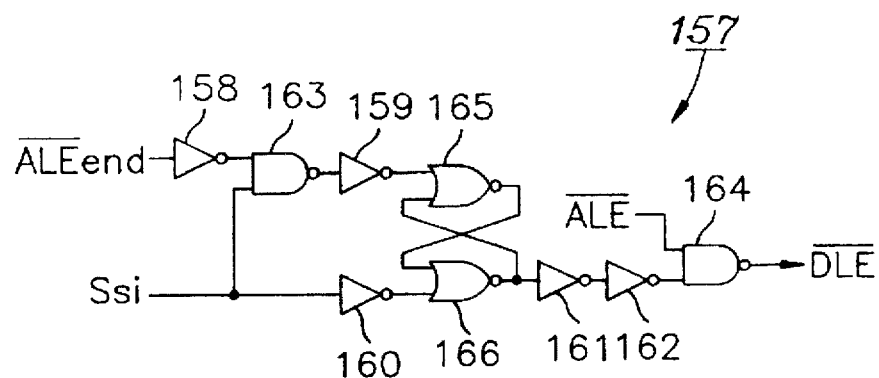

Referring to FIG. 5B, a control circuit 157 for generating a data loading enable signal $\overline{DLE}$ upon completion of the address loading operation and the presetting operation is shown. The control circuit 157 consists of inverters 158 to 162, NAND gates 163 to 164, and NOR gates 165 and 166.

An output terminal of the inverter 158 inputs an address latch end signal $\overline{ALE}_{end}$ from the control circuit 126 in FIG. 5A and the data loading command flag signal Ssi are respectively connected to two input terminals of the NAND gate 163. The signal Ssi is inputted to the inverter 160. Two input terminals of the NAND gate 164 are respectively connected to a compensating address latch enable signal $\overline{ALE}$ of the address latch enable signal ALE from the control buffer to which the external address latch enable signal ALEx is inputted, and to the output terminal of an inverter 162.

Figure 5C:
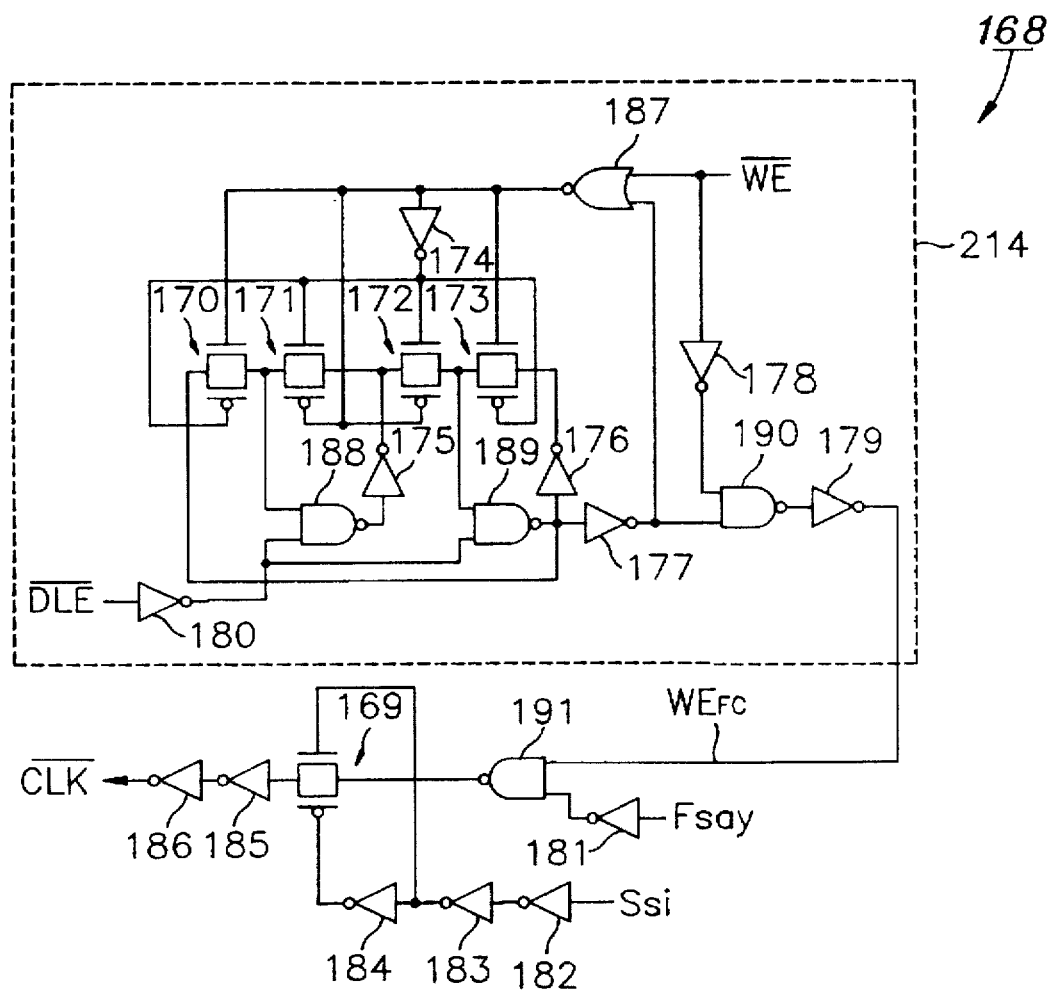

Referring to FIG. 5C, a control circuit 168 for providing the clock signal $\overline{CLK}$ for the column address counter 46 is shown. The control circuit 168 is activated by the data loading enable signal $\overline{DLE}$ from the control circuit 157 in FIG. 5B. The control circuit 168 consists of the transmission gates 169 to 173, inverters 174 to 186, NAND gates 188 to 191, and a NOR gate 187. A circuit portion 214, which includes the NOR gate 187, the transmission gates 170 to 173, NAND gates 188 to 190, and the inverters 174 to 180 represents a counter. The counter 214 is activated by the data loading enable signal $\overline{DLE}$. After being activated, the clock signal $\overline{CLK}$ is generated from a toggling of the write enable signal $\overline{WE}$.

Now, an explanation of a preferred embodiment of the present invention shown in FIGS. 2 to 5 will be described in detail with reference to FIG. 6.

Figure 6:
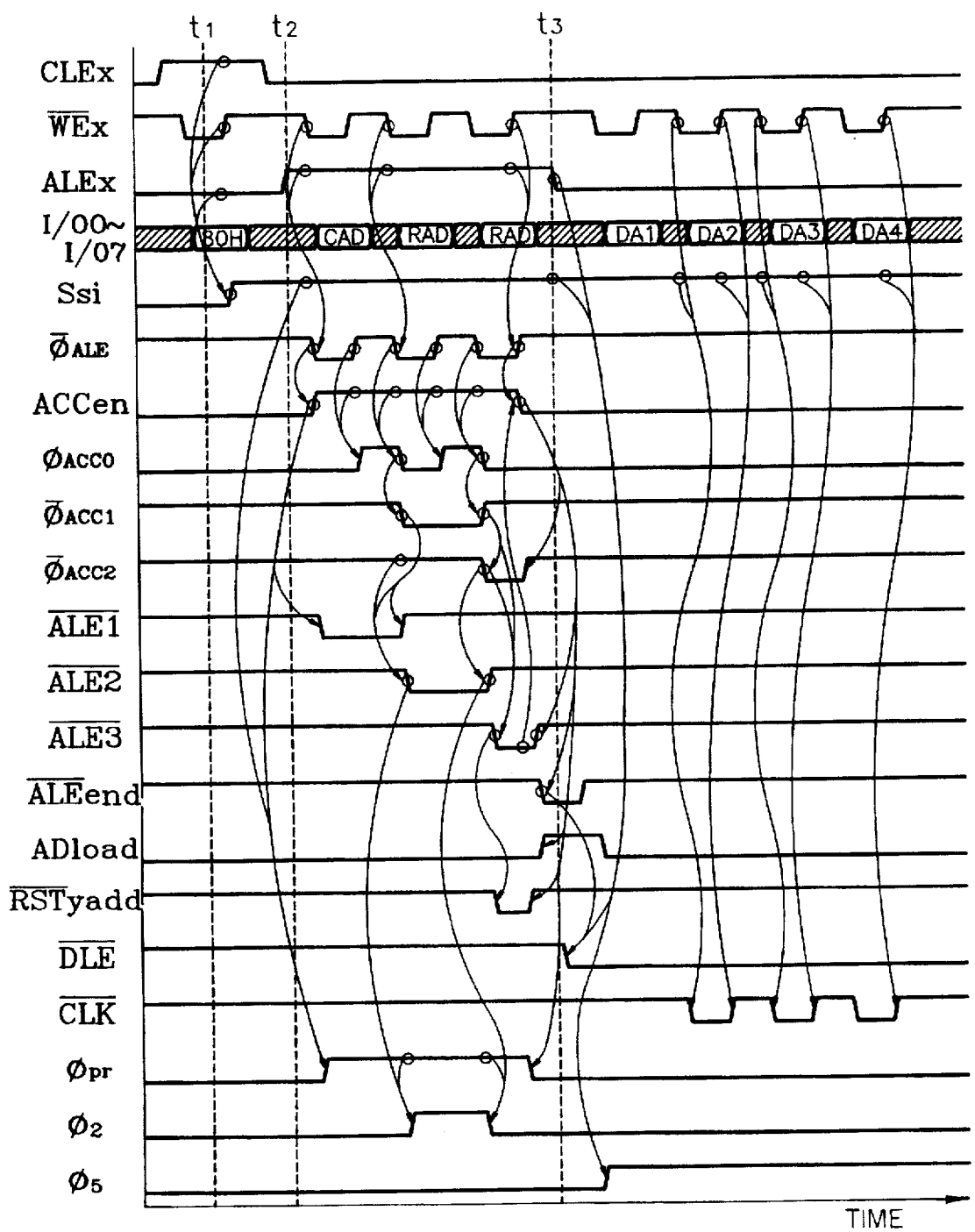
FIG. 6 is a timing chart illuminating a timing relationship a number of control signals associated with the operation of a data loading signals of FIG. 2.

Referring to FIG. 6, a data loading command is issued at a time $t_1$. The data loading command is carded out by inputting a data loading command code 80H (hexa code) through the data input/output terminals I/00 to I/07, when the external command latch enable signal $CLE_x$ is in the "H" state and the external write enable signal $\overline{WE}_x$ and the external address latch enable signal $ALE_x$ are in the "L" state. The known control buffer (not shown) converts the signals $CLE_x$, $\overline{WE}_x$, and $ALE_x$ to an internal CMOS level and these converted signals are inputted to a command register (not shown). The command register outputs the data loading command flag signal Ssi going to the "H" state after inputting the data loading command code. Thereafter, when the external command latch enable signal $CLE_x$ is in the "L" state and the external address latch enable signal $ALE_x$ is in the "H" state, that is, during the period of time $t_2$ to $t_3$, the external address signals inputted through the data input/output terminals I/00 to I/07 by toggling of the external write enable signal $WE_x$ are stored in the address buffer (not shown). The above mentioned storing operation of the external address signals to the address buffer is carried out as shown below.

When the external address latch enable signal $ALE_x$ is in the "H" state during the period of time $t_2$ to $t_3$, the compensating signal $\overline{ALE}$ of the address latch enable signal ALE from the control buffer is in the "L" state. Therefore, the NOR gate 81 in FIG. 4A responds to the write enable signal $\overline{WE}$ from the control buffer and thereby when the address latch clock $\overline{\phi}_{ALE}$ goes to the "L" state through the inverter 75, since the address cycle latch enable signal $\overline{ALE}_3$ is in the "H" state, the control circuit 200 of FIG. 4B generates the address cycle enable signal ACCen going to the "H" state. Thereby, the NAND gate 74 in FIG. 4A is activated and responds to the address latch clock $\overline{\phi}_{ALE}$. Therefore the address cycle clock generating circuit 70 generates the address cycle clock $\phi_{ACC0}$ and its compensating clock $\overline{\phi}_{ACC0}$. The address cycle clock 71, in response to the address cycle clock $\phi_{ACC0}$ and its compensating clock $\overline{\phi}_{ACC0}$, generates address cycle counting clocks $\overline{\phi}_{ACC1}$ and $\overline{\phi}_{ACC2}$ as shown FIG. 6. The address cycle decoder 72 decodes the address cycle counting clocks $\overline{\phi}_{ACC1}$ and $\overline{\phi}_{ACC2}$ generate the address cycle latch enable signals ALE1 to ALE3 sequentially. Therefore the external column address signals CAD which are inputted to the data input/output terminals I/00 to I/07 when the external write enable signal $\overline{WE}_x$ is in the "L" state, are stored in the column address buffer activated by the address cycle latch enable signal $\overline{ALE1}$ being in the "L" state, and then external row address signals RAD which are inputted to the data input/output terminals I/00 to I/07 when the external write enable signals $\overline{WE}_x$ are in the "L" states, are sequentially stored in the row address buffer activated by the signals $\overline{ALE\,2}$ and $\overline{ALE\,3}$ being in the "L" states.

By the signal $\overline{ALE3}$ being in the "L" state and the address latch clock $\overline{\phi}_{ALE}$ going to the "H" state after the above-mentioned external address signals are latched to the address buffer, the address cycle counter enable signal ACCen from the control circuit 200 in FIG. 4B goes to the "L" state. Thereby, the address input control circuit 69 in FIG. 4A is disabled. Therefore, the signals $\overline{\phi}_{ACC2}$ and $\overline{ALE3}$ go to the "H" state.

On the other hand, the control circuit 126 in FIG. 5A generates, in response to the address cycle latch enable signal $\overline{ALE3}$ going to the "L" state when the write enable signal $\overline{WE}$ being in "L" state, the reset signal $\overline{RST}_{yadd}$ going to the "L" state. In response to the write enable signal going to the "H" state, the reset signal $\overline{RST}_{yadd}$ goes to the "H" state. The NAND gate 146 in FIG. 5A is activated by the address cycle counter enable signal ACCen going to the "L" state and responds to the signal $\overline{ALE3}$ being in "L" state so that the address latch end signal $\overline{ALE}_{end}$, i.e., a short pulse signal being in the "L" state, is generated from the control circuit 126. Similarly, the address load signal ADload, i.e., a pulse signal being in the "H" state delayed by a delay circuit 154 is generated from the control circuit 126. Therefore, the column address counter 46 is reset by the reset signal $\overline{RST}_{yadd}$ being in the "L" state, and the column address signals A0 to A7 all become the "L" states. After resetting of the column address counter 46, the column address counter 46 loads the column address signals PA0 to PA7 by inputting the address load signal ADload, i.e., the pulse signal being in the "H" state in order to output them from the column address buffer mentioned above. Therefore, the column address counter 46 loads initial column address signals designated by the external column address signal. During the address loading operation mentioned above, the presetting operation is performed. In response to the address cycle counter enable signal ACCen being in the "H" state when the data loading command flag signal Ssi being in the "H" state, the control circuit 116 in FIG. 4C generates the preset signal $\phi_{pr}$ being in the "H" state. Also, in response to the preset signal $\phi_{pr}$ being in the "H" state and the address cycle latch enable signal $\overline{ALE2}$ being in the "L" state, the control circuit 119 in FIG. 4D generates the control signal $\phi_2$ being in the "H" state. Therefore, the N-type transistors 44 and 31 and the P-type transistor 32 shown in FIG. 2 are turned on by the preset signal $\phi_{pr}$ and the control signal $\phi_2$ being in the "H" states, and the latch circuits 28 constituting the page buffer are reset to the "H" state, i.e., the data lines 26 are reset to data "1".

After the external address latch enable signal $ALE_x$ goes to the "L" state at a time $t_3$, the control circuit 157 shown in FIG. 5B generates the data loading enable signal $\overline{DLE}$ which is latched in the "L" state with the address latch end signal $\overline{ALE}_{end}$ going to the "H" state. Similarly, the data loading operation is performed while the control signal $\phi_5$ goes from the "L" state to the "H" state after the time $t_3$.

After the time $t_3$, the control circuit 168 shown in FIG. 5C is activated by the data loading enable signal $\overline{DLE}$ going to the "L" state. After the time $t_3$, a first toggling of the external write enable signal $\overline{WE}_x$ is not outputted by the operation of a counter 214. The counter 214 outputs the clock signal $WE_{FC}$ from a second toggling of the external write enable signal $\overline{WE}_x$, thereby generating the clock signal $\overline{CLK}$ as shown in FIG. 6.

It is assumed that partial programming is carried out to a single row of memory cells associated with 10-th columns to 13-th columns of the column blocks $CB_k$ of the memory cell array. Then, the initial external column address signals which designate 10-th columns are latched to the column address counter 46 through the column address buffer in the above-mentioned way. The column decoder 40 shown in FIG. 2 decodes the initial column address signals latched to the column address counter 46 at the time $t_3$ and turns on 10-th transmission transistors $T_{10}$. After the time $t_3$ the transmission gates 29 are turned on by the control clock $\phi_5$, and one byte of data which is provided to the data input/output terminals I/O0 to I/O7 by the first toggling of the external write enable signal $\overline{WE}_x$ is latched to the latch circuits 28 connected with the corresponding data lines 26 through the data input buffer 42, the transmission transistors $T_{10}$ and the corresponding transmission gates 29. Thereafter, in response to the clock signal $\overline{CLK}$ generated by the second toggling of signal $\overline{WE}_x$, the column address counter 46 performs a count-up operation, thereby generating on the transmission line $TL_{11}$ a signal which activates the 11-th transmission transistors $T_{11}$ from the column decoders 40. Then, the next one byte of data which is provided to the data input/output terminals I/O0 to I/O7 by a second toggling of the signal $\overline{WE}_x$ is stored to the corresponding latch circuits 28 through the turned on 11-th transmission transistors $T_{11}$. In this way, data which is inputted through the data input/output terminals I/O0 to I/O7 by third and fourth toggling of the signal $\overline{WE}_x$ are stored in the corresponding latch circuit 28 through 12th and 13th transmission transistors $T_{12}$ and $T_{13}$. In the same manner as described above after 4 bytes of data are stored in the corresponding latch circuits 28, by a program command, i.e., by a command which is generated by inputting a program command code 10H (hexa code) with the external command latch enable signal CLEx being in the "H" state and the external write enable signal $\overline{WE}_x$ being in the "L" state, the separate control signal SBL and the control signal $\phi_1$ go to the "H" states. Therefore, the 4 bytes of data stored in the corresponding latch circuits 28 are programmed into the corresponding memory transistors by the general programming unit through the corresponding separating gates 25 and the corresponding N-type transistor 23'. But since the preset data which is stored in the remaining latch circuits except for the corresponding latch circuits 28 is predetermined in order to prevent them from being programmed, the memory transistors associated with the remaining latch circuits are not programmed. Programming data which is stored in the page buffer of all memory transistors arranged in a row is disclosed in the United patent application Ser. No. 08/171,300, and it should be noted that such a program is not characterized by the present invention.

As described above, a partial data loading circuit according to the invention is not required to store a page of data in the page buffer prior to the data loading operation, and can shorten a data loading time and a programming time. Further, the partial data loading circuit has an advantage of improving performance of the EEPROM because it stores desired partial data to the page buffer.

What is claimed is:

1. A nonvolatile semiconductor memory comprising:

a plurality of floating gate-type memory cells arranged in a matrix form of rows and columns;

a plurality of bit lines respectively connected to said memory cells arranged in said columns;

a plurality of data lines respectively connected to said plurality of bit lines;

a plurality of latch circuits respectively connected to said plurality of data lines;

preset means for presetting all of said plurality of latch circuits to a predetermined logic state during a presetting operation;

means for loading data to selected ones of said plurality of latch circuits through data input/output terminals during a data loading operation after said presetting operation; and means for programming to said memory cells arranged and erased in one selected row, said data loaded to said selected latch circuits and data presetted to remaining latch circuits except for said selected latch circuits during a programming operation after said data loading operation.

2. The nonvolatile semiconductor memory as defined in claim 1, wherein said plurality of bit lines and said plurality of data lines are connected with a separating gate disposed therebetween, said separating gate being turned on during said programming operation and being turned off during said presetting operation and said data loading operation.

3. The nonvolatile semiconductor memory as defined in claim 1, wherein said predetermined logic state corresponds to data which prevents memory cells corresponding to said latch circuits from being programmed during said programming operation.

4. A nonvolatile semiconductor memory comprising:

a plurality of floating gate-type memory cells arranged in a matrix form of rows and columns;

a plurality of column blocks each having a predetermined number of bit lines among a plurality of bit lines respectively connected to said memory cells arranged in said columns;

a plurality of data lines respectively connected to said bit lines in said column blocks;

a plurality of latch circuits respectively connected to said plurality of data lines;

preset means for presetting all of said plurality of latch circuits to a predetermined logic state during a presetting operation;

a plurality of data input/output terminals corresponding to said plurality of column blocks;

a plurality of data input buffers connected to correspond with said plurality of data input/output terminals; and column selecting means for loading data which is latched to said plurality of data input buffers through said plurality of data input/output terminals in selected ones of said plurality of latch circuits during a data loading operation after said presetting operation, said column selecting means being connected between said plurality of data input buffers and said plurality of data lines.

5. The nonvolatile semiconductor memory as defined in claim 4, wherein said plurality of bit lines and said plurality of data lines are connected with a separating gate disposed therebetween, said separating gate being turned off during said presetting operation and said data loading operation.

6. The nonvolatile semiconductor memory as defined in claim 4, wherein said plurality of data input buffers respond to a write enable signal in order to latch data which is inputted through said plurality of data input/output terminals during said data loading operation.

7. The nonvolatile semiconductor memory as defined in claim 6, wherein said column selecting means has a column address counter responsive to said write enable signal, which performs a count-up operation during said data loading operation.

8. The nonvolatile semiconductor memory as defined in claim 4, wherein said predetermined logic state corresponds to data which prevents memory cells corresponding to said latch circuits from being programmed during said programming operation.

9. A partial page programming method performed after erasing memory cells arranged in at least one selected row in a nonvolatile semiconductor memory, said nonvolatile semiconductor memory having a plurality of floating gate-type memory cells arranged in a matrix form of rows and columns, a plurality of bit lines respectively connected to said memory cells arranged in said column, a plurality of data lines respectively connected to said plurality of bit lines, a plurality of latch circuits respectively connected to said plurality of data lines, and a plurality of data input/output terminals, said method comprising the steps of:

presetting all of said plurality of latch circuits to predetermined data;

loading data to selected ones of said plurality of latch circuits through said plurality of data input/output terminals; and programming said memory cells arranged in said one selected row to data which is stored in said plurality of latch circuits, said predetermined data presetted to remaining latch circuits except for said selected latch circuits preventing memory cells corresponding to said remaining latch circuits from being programmed.

10. A nonvolatile semiconductor memory, comprising:

a plurality of memory cells arrayed in rows and columns;

a plurality of bit lines respectively connected to memory cells arranged in said columns;

a plurality of latch circuits respectively operably connected to said bit lines;

a preset circuit which presets all of said latch circuits to a first state during a presetting operation;

a data loading circuit which sets selected ones of said latch circuits to a second state different than said first state during a data loading operation after said presetting operation; and a programming circuit which programs memory cells within a selected row and in columns corresponding to said selected ones of said latch circuits, and which prevents programming of memory cells in columns not corresponding to said selected ones of said latch circuits, during a programming operation after said data loading operation and after all memory cells in said selected row have been erased.

11. A nonvolatile semiconductor memory as defined in claim 10, further comprising a column selection circuit which receives a column address and which determines said selected ones of said latch circuits in accordance with said column address.

12. A nonvolatile semiconductor memory as defined in claim 11, wherein said column selection circuit includes a column address counter which increments said received column address in response to a write enable signal and wherein said selected ones of said latch circuits correspond to consecutive adjacent columns.

* * * * *